United States Patent [19]

Fidric et al.

[11] Patent Number: 5,761,225
[45] Date of Patent: Jun. 2, 1998

[54] OPTICAL FIBER AMPLIFIER ELED LIGHT SOURCE WITH A RELATIVE INTENSITY NOISE REDUCTION SYSTEM

[75] Inventors: Bernard C. Fidric, Woodland Hills; Ronald James Michal, Wrightwood; James Ross Steele, Northridge; Eric Lee Goldner, Valencia; Ralph A. Patterson, Moorpark, all of Calif.

[73] Assignee: Litton Systems, Inc., Woodland Hills, Calif.

[21] Appl. No.: 652,770

[22] Filed: May 23, 1996

[51] Int. Cl.$^6$ ...................................................... H01S 3/30
[52] U.S. Cl. ............................................................. 372/6
[58] Field of Search ................................................. 372/6

[56] References Cited

U.S. PATENT DOCUMENTS

| | | | |
|---|---|---|---|
| 4,637,025 | 1/1987 | Snitzer et al. | 372/1 |
| 4,674,830 | 6/1987 | Shaw et al. | 350/96.15 |
| 4,723,824 | 2/1988 | Shaw et al. | 350/96.15 |
| 4,859,016 | 8/1989 | Shaw et al. | 350/96.15 |
| 4,938,556 | 7/1990 | Digonnet et al. | 350/96.15 |
| 5,136,600 | 8/1992 | Fidric et al. | 372/32 |
| 5,640,473 | 6/1997 | Wheeler et al. | 372/27 |

OTHER PUBLICATIONS

Noise Characteristics of Rare-Earth-Doped Fiber Sources and Amplifiers—Reprinted from Fiber Laser Sources and Amplifiers, Proc. SPIE vol. 1373., pp. 224–233 (1990)©1990 Society of Photo–Optical Instrumentation Engineers—P.R. Morkel, R.I. Laming, G.J. Cowle & D. N Payne, No Month.

*Primary Examiner*—Rodney B. Bovernick
*Assistant Examiner*—Robert E. Wise
*Attorney, Agent, or Firm*—James F. Kirk

[57] ABSTRACT

A power boosted source of broadband optical power comprising a broadband light source, optical fiber amplifier and a relative intensity noise reduction system. The optical fiber amplifier amplifies the power level of the optical input signal to provide a power boosted source of broadband optical power out of an output port. A coupler samples a portion of the broadband optical power out of the output port as a sample portion signal. A detector and transimpedance amplifier detect the optical signal and provide a buffered signal having an instantaneous amplitude that faithfully characterizes the intensity of the sample portion signal. A bandpass amplifier amplifies the buffered signal and provides an output control signal to a light source responsive to a composite bias and control current for providing an output optical signal. The output optical signal is coupled to the input of the optical fiber amplifier to be the optical input signal to the optical fiber amplifier. The output optical signal from the ELED has a substantially constant output intensity level and smooth and bell shaped broad band spectrum with a center optical wavelength within the gain bandwidth of the optical fiber amplifier.

11 Claims, 5 Drawing Sheets

OPTICAL FIBER AMPLIFIER ELED LIGHT SOURCE WITH A RELATIVE INTENSITY NOISE REDUCTION SYSTEM

BACKGROUND OF THE INVENTION

1. Field of Invention

The invention relates to Edge-emitting Light Emitting Diodes (ELED's), optical fiber amplifiers and more particularly to superfluorescent broadband fiber lasers such as those used as light sources in fiber optic gyros having RIN (relative intensity noise) present on the optical output.

2. Related Art

ELED's such as the MREDSP003-1 made by the MRV Communications Inc. of 8943 Fulbright Ave., Chatsworth Calif. 91311. USA are characterized as being able to provide an optical output having a smooth and very broad spectrum. However, the present output power of available ELED's is limited to a level that is considered too low for use as a source of light for interferometric rotation sensors such as a fiber optic gyro or for other applications such as communications. Higher power levels are required for the purpose of achieving a good signal to noise ratio in the output signal for such applications.

Superfluorescent broadband doped fiber laser sources are also capable of supplying broad-band laser light but such sources typically have side lobes of output power. The fabrication of Superfluorescent broadband doped fiber laser sources is described in U.S. Pat. Nos. 4,637,025 to Snitzer, et al.; 4,938,556 to Digonnet, et al., which is a continuation in part of 4,859,016 to Shaw, et al, which is a division of 4,723,824 which is a division of 4,674,830 (all for fiber optic amplifiers); and 5,136,600 to Fidric, et al., which are incorporated herein by reference in their entirety.

The superfluorescent fiber lasers and amplifiers in the above referenced patents generally comprise an optical fiber having its core or cladding or both doped with an active laser material and pumped at an appropriate optical wavelength and sufficient intensity to produce amplified spontaneous emission (ASE). These patents disclose both single pass and double pass configurations.

In a single pass configuration the amplified output signal results from the input signal passing only once through the active gain region. In a double pass configuration a dichroic filter or a mirror and coupler are employed to reflect the amplified spontaneous emission signal backward (but not necessarily the pump signal) through the doped fiber for second-pass amplification of the amplified spontaneous emission. Unfortunately the latter configuration is sensitive to optical feedback of the output signal from the doped fiber, which causes an onset of oscillating modes and a resultant narrow band emission. Such an oscillating condition prevents operating these devices as high power broadband light sources.

In a paper by P. R. Morkel et al. titled "Noise characteristics of rare-earth-doped fiber sources and amplifiers" that appeared in Fiber Laser sources and Amplifiers, Proc. SPIE Vol. 1373 pp. 224–233 (1990) the authors review and quantify the noise mechanisms in several types of rare-earth doped fiber sources.

In the Abstract of this reference, the authors comment that "Spontaneous emission noise presents an ultimate limit to the performance of a number of fiber laser and amplifier devices". Noise sources identified in the article included: Pump Noise feed-through due to variations in the pump power; spontaneous-spontaneous and signal spontaneous beat noise which degrade the detected signal-to-noise ratio: Phase noise; in Resonant Cavity Fiber Lasers, Relaxation oscillations, signal shot noise or beating of the signal with the residual amplified spontaneous emission (signal-spontaneous beat noise); and finally, in Superfluorescent broadband fiber lasers, excess photon noise due to beating of the different parts of the broadband emission spectrum (spontaneous-spontaneous beat noise). The latter phenomenon is responsible for the relative intensity noise (RIN) of the superfluorescent fiber sources. For interferometric fiber optic gyro (IFOG) operation in which output optical power levels are greater than about 10 µW, the dominant noise source is RIN. Related art for reducing the effects of RIN within an IFOG include over-modulation and random modulation such as the method and apparatus depicted in U.S. Pat. No. 5,123,741, to Gunter Spahlinger for a Fiber Optic Sagnac Interferometer With Digital Phase Ramp Resetting via Correlation-Free Demodulator Control assigned to Litef Gmbh, Freiburg, Fed. Rep. of Germany.

Each of these methods have practical drawbacks. Noise subtraction has only been reported to reduce the level of RIN by about 3 Db. Overmodulation inherently reduces the signal level, therefore requiring increased optical source power at very deep modulation depths.

SUMMARY OF INVENTION

It a first object of the invention to provide a broadband source of optical power by amplifying the optical output of an ELED with a commercially available Optical Fiber Amplifier (OFA) and using the optical power from the output of the OFA as an optical source for a fiber optic Gyro. It is a second objective of the invention to reduce the RIN (Relative Intensity Noise) present on the optical output of a broadband source of optical power obtained by amplifying the optical output of an ELED with a an OFA by sampling the optical output to obtain a sample portion of the optical output, detecting and amplifying the amplitude of the sample portion signal to provide a buffered signal, amplifying and filtering the buffered signal to provide a control signal, and by subtracting a current proportional to the control signal from a bias current through the ELED to increase or decrease the intensity of the ELED as required to suppress RIN excursions on the optical output.

For fiber optic gyro applications, the OFA contemplated uses an internal active fiber doped with a lazing material and an internal pump diode for pumping the doped fiber. The subject invention samples or taps a small percentage of light leaving the amplifier output for a sample portion signal and detects and electrically amplifies the sample portion to provide a detected signal that faithfully characterizes the intensity with amplitude noise present in the light at the amplifier output. The detected noise signal is then further amplified and used to compensate the drive current to an ELED (edge-emitting light emitting diode) that sources light at a wavelength that falls within the gain bandwidth of the optical amplifier.

The optical signal from the ELED is introduced into the optical amplifier as an optical signal input. The sample portion of the amplified signal is processed by a feedback control loop and phase conditioned as an error signal to obtain cancellation of the amplitude of the noise detected at the output of the amplifier. The invention circuit thereby compensates for intensity noise fluctuation in the light leaving the amplifier output by changing the drive current to the external ELED to achieve RIN reduction.

It is therefore, an objective of this invention to sample the output light from an optical amplifier, and to detect, filter and amplify the amplitude noise signal on the output light and control an ELED which provides an optical feedback signal at the ASE wavelength to the input to the optical amplifier, the phasing of the feedback error signal being predetermined to reduce the RIN noise present at the device output. This and other objectives are accomplished in the invention optical amplifier relative intensity noise reduction system.

In a first alternative embodiment, the noise reduction system is coupled to source input light (an input light ray via an optical fiber) from an ELED to the input port of an optical amplifier. The optical amplifier amplifies the input light and provides an output light source from an output port. An undesirable level of relative intensity noise is present on the light output from the output port.

An optical coupler has an input port coupled to receive the output light sourced from the optical amplifier output port. The optical coupler also has a coupler sample port and a coupler output port. The coupler provides a small portion of the output light source signal to the sample port and outputs the sample light as a sample signal. The coupler sources the remainder of the received light to its output port.

A detector is coupled to receive and respond to the sample signal. The detector is biased to transform the varying intensity of the sample signal into an electrical signal. An electrical amplifier amplifies the detected signal 36 to form and provide a buffered signal 42 that faithfully amplifies and replicates the optical power of the sample signal.

A bandpass amplifier amplifies the buffered electrical signal over a predetermined bandwidth and outputs a control signal. A bias current source provides a fixed bias current to a laser diode (an ELED). The ELED outputs an output optical signal, i.e. the input light ray to the input port of the optical amplifier.

DESCRIPTION OF THE PREFERRED EMBODIMENT

Figure 1:
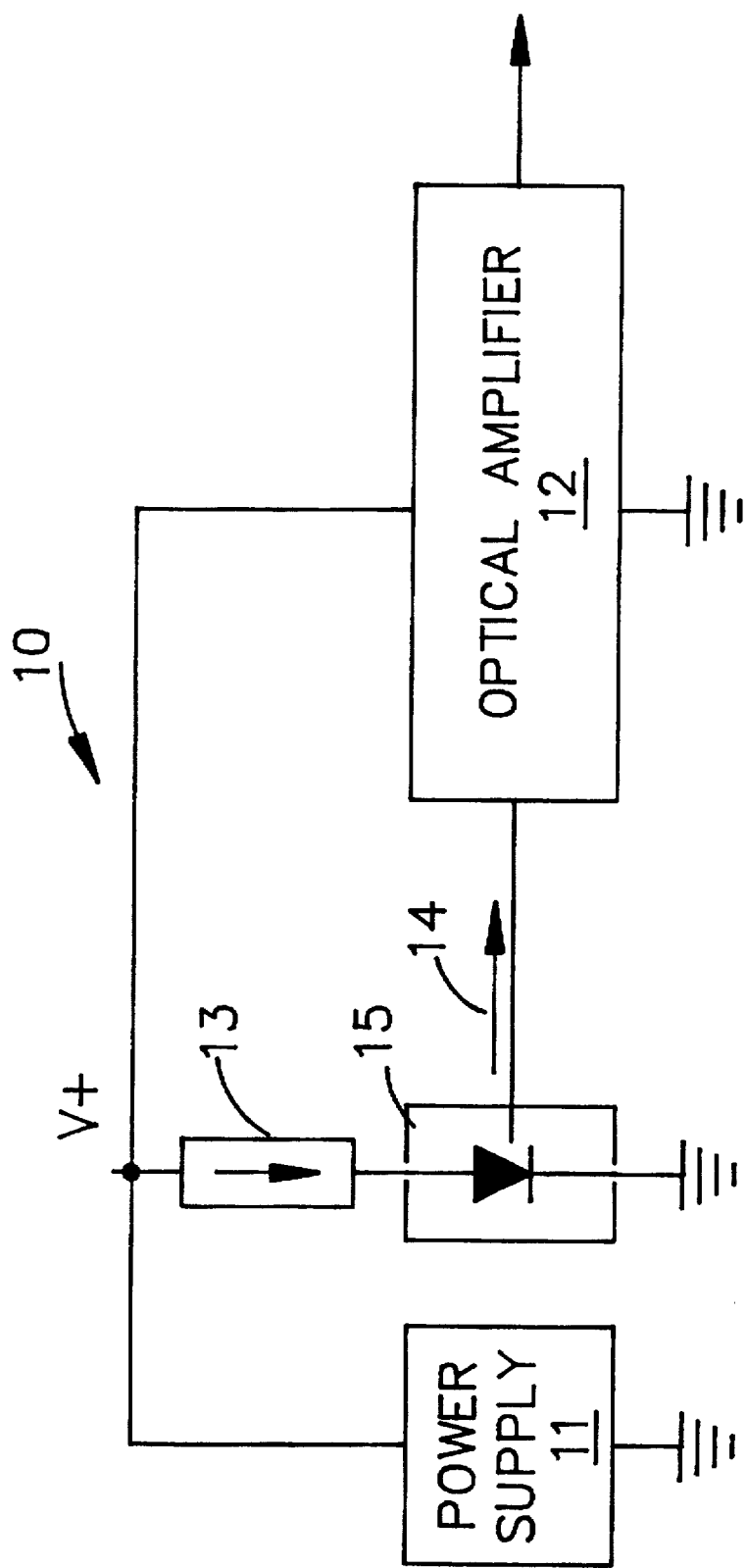
FIG. 1 is a block diagram of the invention power boosted source of broadband optical power showing an ELED signal source in combination with an Optical Amplifier.

FIG. 1 is a schematic representation of a power boosted source of broadband optical power 10. An electrical power supply 11 sources electrical power to optical amplifier 12 and to a current source 13. The current source 13 delivers a drive or bias current to control the intensity of the output optical signal 14 from a broad-band light source such as ELED diode 15 to the input port 20 of optical amplifier 12.

The ELED 15 diode is an Edge-emitting LED such as the MREDSP5003-1 made by MRV Communications of Chatsworth, Calif. An ELED diode typically operates with a bias current of 50-80 Ma, a Vf of 1.2-1.7 V and produces 30-60 Uw of average output power with a power spectral density (PSD) that has a smooth broad-band distribution similar to that of the graph of FIG. 4.

Figure 4:
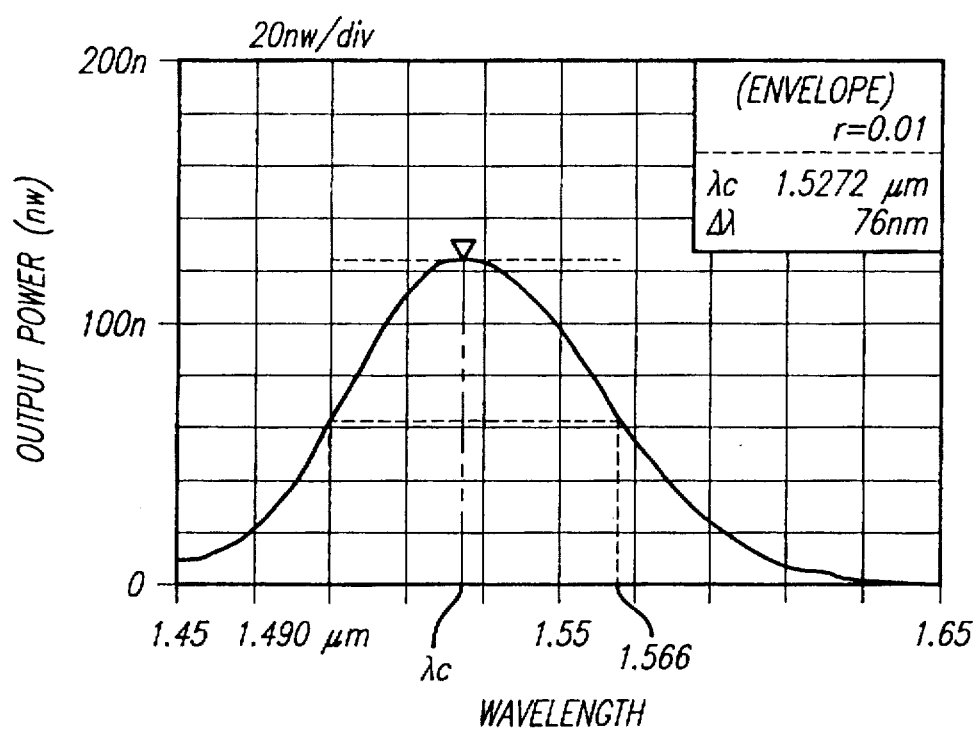
FIG. 4 is a representative graph of the optical emission spectrum of an ELED.

A forward biased ELED is a fairly inexpensive light source for providing a broadband optical signal having a spectral shape similar to that of FIG. 4. However, the average output signal power that is obtainable from commercially available ELEDs' is insufficient to function as the light source for some applications and in particular, the light source for a triax of three Fiber Optic Gyros. This invention proposes the use of an optical amplifier 12 in combination with ELED 15 to amplify the output optical signal 14 to obtain a power boosted optical signal having sufficient optical power at optical amplifier output port 18.

Figure 2:
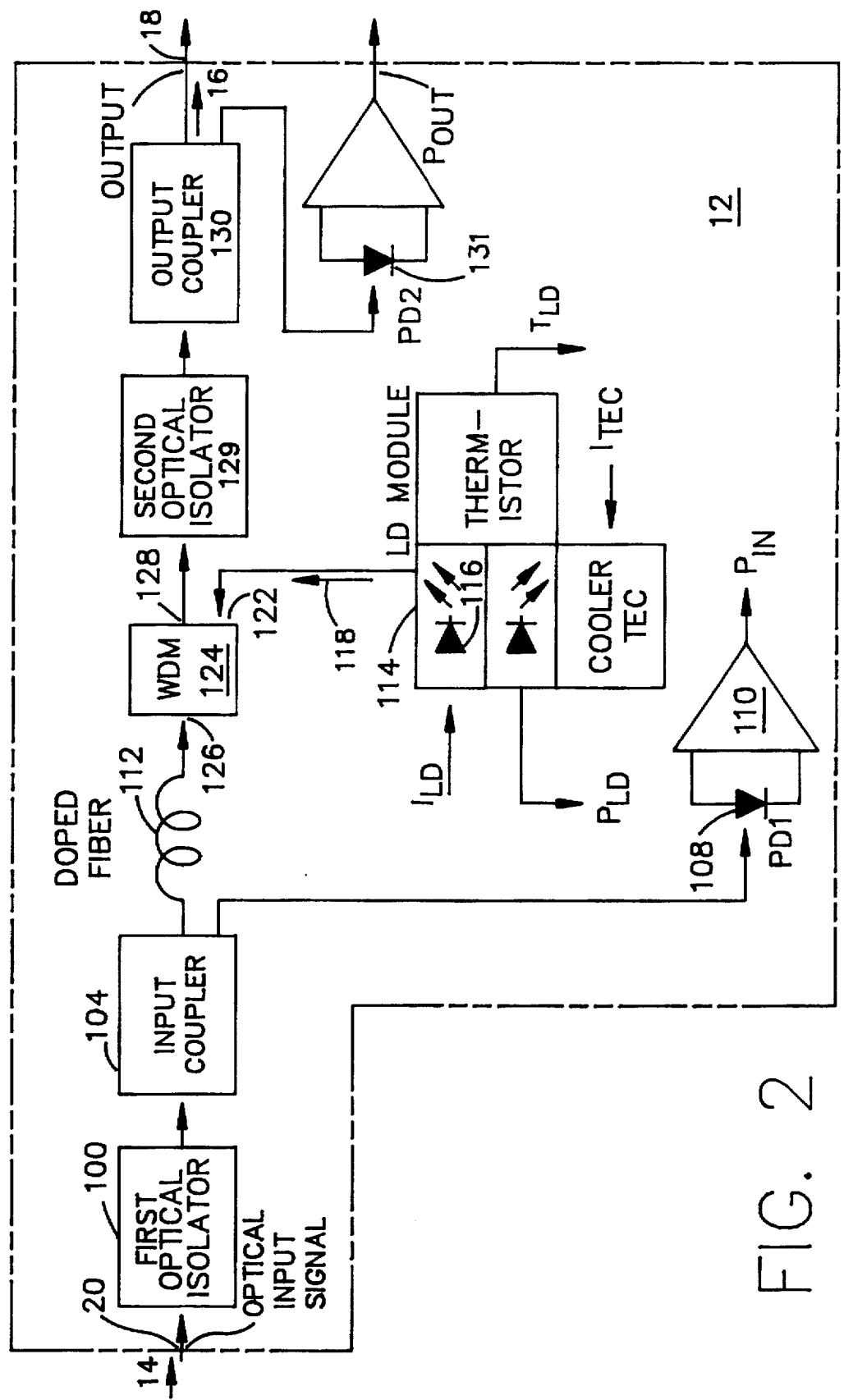
FIG. 2 is a block diagram of one particular embodiment (single-pass, counter-propagating pump) of an optical fiber amplifier.

Referring to FIG. 2, the Optical Amplifier 12 receives the output signal at input port 20 and amplifies or boosts the power of the output signal by a factor of 10-1000 times before outputting the boosted signal as the a power boosted optical signal 16 at output port 18. The gain of the Optical Amplifier over the bandwidth of interest is approximately flat which results in the power boosted optical signal 16 out of output port 18 having an output power spectrum similar to the shape of that shown in FIG. 4.

Figure 3:
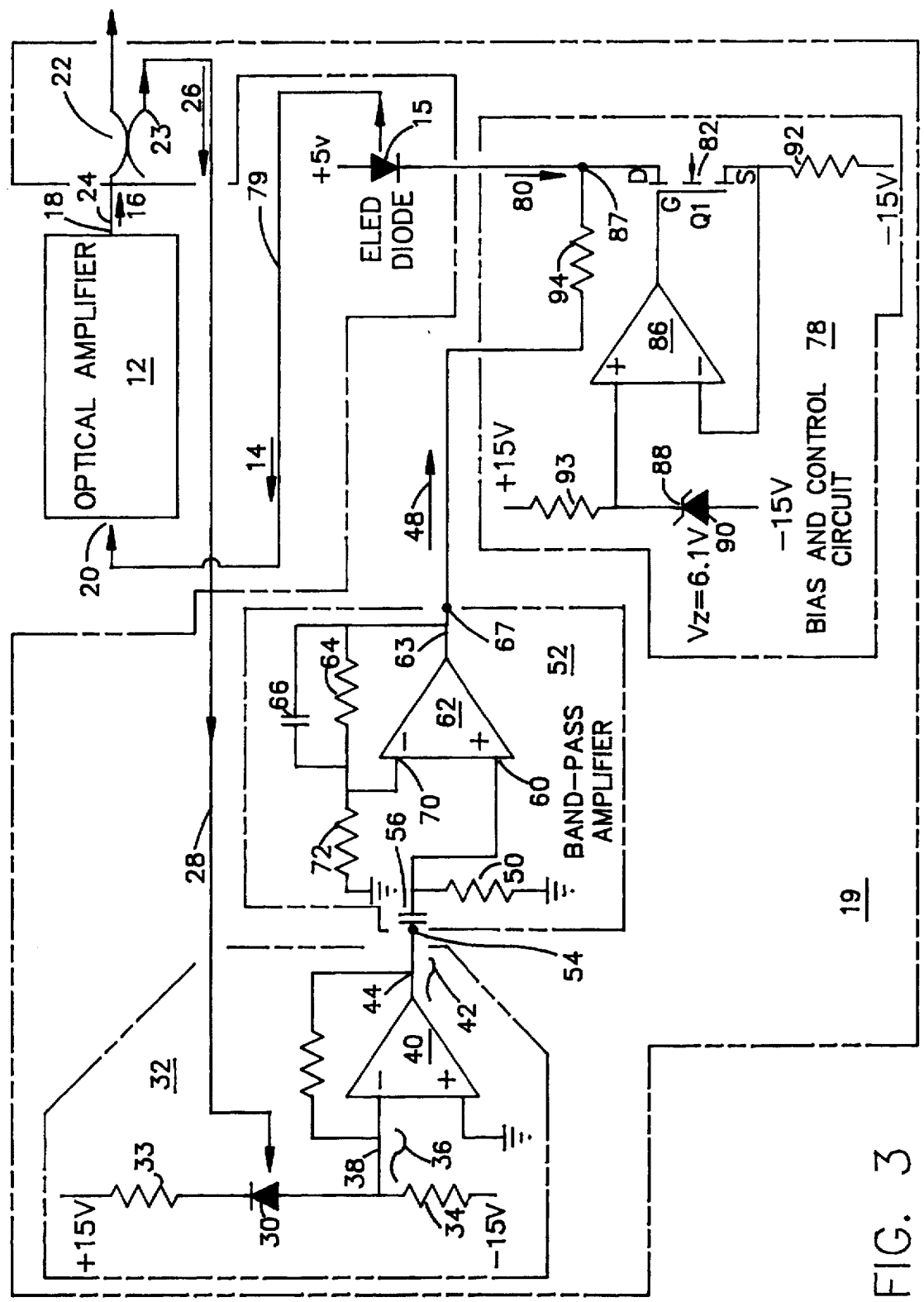
FIG. 3 is a schematic representation of a power boosted source of broadband optical power operating in combination with relative intensity noise reduction system.

FIG. 3 shows the power boosted source of optical power 10 comprising optical amplifier 12 and ELED DIODE 15 operating in combination with a relative intensity noise reduction system within phantom block 19. The function of the current source 13 of FIG. 1 is performed by the bias and control circuit within phantom block 78.

The optical amplifier relative intensity noise reduction system 19 typically comprises a detector and amplification means such as that shown within phantom block 32 for detecting and amplifying the amplitude envelope of the sample portion optical signal and for providing a buffered signal to a band-pass amplifier 52.

Coupler 22 couples a sample portion signal shown as ray 26 from the power boosted optical signal shown as ray 16 to detector 30. Detector 30 is biased to respond to the sample portion signal to form a detected signal that substantially represents the power amplitude envelope of the sample portion signal as a time varying voltage signal.

An amplifier 40 amplifies the detected signal to form a buffered signal that is coupled to the input terminal 54 of the band-pass amplifier 52. The buffered signal at input terminal 54 is substantially independent of the input impedance of the band-pass amplifier 52 due to the relative low output impedance of amplifier 40.

The circuit within phantom block 52 represents one embodiment of the band-pass filter and bias and control circuit means for amplifying and filtering the buffered signal to form a control signal voltage at the band-pass filter and bias and control circuit means output terminal 57. The band-pass filter and bias and control circuit means for responds to the buffered signal, and converts the control signal into a control current that passes via output resistor 94 to summing point 87 in the bias and control circuit within phantom block 78. Resistor 94 is used to convert the control signal 48 (the bandpass output signal) to a control current 95 into the summing point 87. The control current 95 is proportional to the difference between the voltage at the summing point 87 and the control voltage 48 divided by the value of the resistor 94.

The bias and control circuit 78 combines the control current from resistor 94 with a bias current from the drain of FET 82 to form the composite bias and control current that passes through the ELED 15 to reduce relative intensity noise on the power boosted optical signal out of the output port 18. The intensity of the output optical signal (represented in FIG. 3 by ray 14) has an intensity proportional to the difference between the bias current 91 through resistor 92 and the control current 95 through resistor 94.

The optical amplifier within phantom box 12 of FIG. 2 is a single pass optical amplifier available commercially as P/N OA-1015-WT from Light Wave Products. Litton Guidance and Control Systems. 5500 Canoga Avenue. M/S 055. Woodland Hills, Calif. 91367-6698. By way of example, the specifications for this unit are such that at 25° C. ambient, the unit typically requires less than 1 watt of power, has an optical gain bandwidth of 1525–1565 nanometers and a signal output power (for a Pin>–3 dbm) of 15 Dbm with a noise figure of <6.0 Db.

Most commercially available optical amplifiers are single pass systems, however double pass optical amplifiers and optical amplifiers with more than one pump diode are also available. A double pass optical amplifier is taught in U.S. Pat. No. 5,311,603 issued to B. Fidric on May 10, 1994 and having a common assignee, the contents of which are incorporated herein by reference in their entirety.

Operation of an the optical amplifier 12 is explained beginning at the left of FIG. 2 with the arrival of the optical input signal 14 from the ELED diode 15 at input port 20. Input port 20 passes the optical input signal through a first optical isolator 100. The first optical isolator is polarization independent and functions essentially as an optical diode in that it allows the optical input signal to pass through it from the optical input 20 to the right but blocks any light that attempts to pass through it from the right to the left.

Input coupler 104 is a broad-band optical splitter that provides a sample of the polarized input optical signal to an input signal monitor detector 108 and amplifier 110 that provides an input power monitor signal, $P_{IN}$ as an output. The function of this sample function is optional and not essential for the invention's operation. The remainder of the polarized input optical signal is coupled from the input coupler 104 to the doped fiber 112 in which amplification of the signal is achieved. The doped fiber is typically doped with Erbium.

Within pump light source assembly 114, pump laser diode 116 is driven by an input current to supply pump light represented by pump ray 118 to the first input 122 of WDM (wavelength dependent multiplexer) 124. WDM 124 permits substantially all of the light from pump ray 118 to pass into the doped fiber 112 where most of the pump light energy is absorbed by the doped fiber in producing amplification of the optical input signal 14 and a small amount of amplified spontaneous emission (ASE). The latter ASE leaves the doped fiber 112 in both directions.

The ILD signal represents the input drive current to the pump diode 116. The TLD signal term represents a thermistor output characterizing the temperature of the pump diode. The PLD signal term is a sample term characterizing the optical output power of the pump diode. The ITEC signal term represents an input drive current term to a thermoelectric cooler for controlling the temperature of the pump diode 116. The TLD, PLD and the ITEC terms are necessary for high accuracy applications that require high stability in the amplifier performance characteristics but which are not critical to the basic principles of this invention. Some of these signal and control terms may not be available on lower cost or comparable amplifiers. Terms similar to the TLD, PLD and the ITEC terms necessary for high accuracy applications are discussed in U.S. Pat. No. 5,313,480 that issued to B. Fidric et al on May 17, 1994 having a common assignee the contents of which are incorporated herein by reference in its entirety.

Referring again to FIG. 2 and the doped fiber 112, a portion of the ASE superfluorescent light passes out of the left end of the doped fiber to the first splitter 104 and then enters the first optical isolator 100. All of the ASE light entering the optical isolator 100 is absorbed including any residual pump light.

The ASE light and the amplified optical input signal exiting the right end of the doped fiber 112 enter the WDM 124 at input port 126 and exits at output port 128. The WDM 124 prevents the ASE light and the amplified optical input signal from being output at pump port 122. The WDM is wavelength selective and blocks the longer wavelength of the ASE light and the longer wavelength of the amplified optical input signal from passing out of port 122.

The amplified signal at WDM output 128 passes through the second optical isolator 129 (and then through the output coupler 130) as the power boosted optical signal out of output port 18. The output coupler 130 and the PD2 detector are optional and not essential to the invention.

FIG. 3. shows the optical amplifier 12 providing the power boosted optical signal or optical output represented by ray 16 from an output port 18. The power boosted optical signal or light source 16 is typically a broad band light source. In the preferred embodiment, light from the optical amplifier output port 18 typically has a broadband spectrum centered at a wavelength of approximately 1550 nm for an optical fiber doped with erbium. As described above, the output optical signal 13, represented by ray 14 is supplied to the input port 20 by the ELED (edge-emitting LED) 15 having a wavelength that substantially falls within the gain bandwidth of the optical amplifier.

Coupler 22, is coupled to receive the power boosted optical signal or light source represented by ray 16 from the output port 18 via fiber 24. Coupler 22 is similar to the model SWB C2101AC210 from the E-Tek Dynamics Company of San Jose, Calif. The coupler 22 is typically a broad band coupler that couples a small portion of the light passing through fiber 24 to detector 30. The small portion is typically less than 5% of the power boosted optical signal passing through fiber 24. It should be understood that a bulk optic splitter could also be specified and used for the function of the coupler 22.

Detector 30 is typically a small geometry low noise InGaAs diode such as an ETX-75-FJ-SLR from the Epitaxx Inc. of West Trenton, N.J. or the RTZ080-055MHZ-028 from Optical Communications Products Inc. of Chatsworth, Calif., 91311.

In FIG. 3, detector 30 is shown back-biased by resistors 33 and 34 to provide a detected sample portion signal 36 to the input 38 of transimpedance amplifier 40. Transimpedance amplifier 40 responds to the sample portion signal and provides a buffered signal, represented by ray 42 at the transimpedance amplifier output 44. The buffered signal 42 is amplified to have an instantaneous amplitude that faithfully characterizes the amplitude of the intensity of the sample portion optical signal 26.

The input port 54 for bandpass amplifier 52 receives the buffered signal 42 and couples it via capacitor 56 to a first terminal of resistor 50, and to the non-inverting input 60 of operational amplifier 62. The second terminal of resistor 50 is grounded. Capacitor 56 in combination with resistor 50 form an input lead network or zero for the bandpass amplifier within phantom block 52.

Feedback resistor 64 and feedback capacitor 66 are coupled from the output 63 of operational amplifier 62 to the inverting input 70 of operational amplifier 62. An input scaling resistor 72 has a first terminal coupled to the inverting input 70 and a second terminal that is grounded. The combination of capacitor 66, resistor 64 and 72 serve to establish the gain and the location of the pole or break frequency for bandpass amplifier 52 which amplifies the buffered signal 42 over a predetermined frequency spectrum, and outputs a control signal represented by ray 48 at the bandpass amplifier output 67.

It should be understood that in another alternative embodiment of the invention, not shown, the buffered signal at 54 could be sampled and converted at a sample rate into a digital value by an analog to digital converter. The series of digital values thus obtained could be processed and filtered using a digital filter in a digital computer the computer would then supply an output to ELED 15 obtained by the use of a digital to analog converter to a drive circuit such as the bias and control circuit 78.

The laser diode, such as ELED 15 is shown forward biased by a composite bias and control current represented by ray 80. The composite bias and control current 80 drives the laser diode, ELED 15 to produce the output optical signal 14 that is coupled via fiber 79 to the optical amplifier 12, input port 20.

FIG. 4 represents the shape of the relatively uniform or smooth broad band output signal provided by ELED 15 with a center wavelength λo at or very close to 1527 nm and with half max power points at or near the 1490 nm and 1566 nm. The 1490 nm and the 1566 nm wavelengths on the independent variable axis represent the 0.5 amplitude ratio or half power points as depicted in FIG. 4.

Bias current 80 to ELED 76 is supplied by the conduction channel of N-channel FET 82. The FET 82 is biased into its active region by a fixed voltage from the output of the voltage follower circuit using operational amplifier 86. The output from the output of operational amplifier 86 to the gate G of FET 82 is a precision voltage reference approximately equal to the voltage on the cathode of reference zener 90. The value of resistor 93 is calculated to establish the best operating point for the precision voltage reference such as diode 90.

It should be understood that there are numerous other conventional circuit topologies for establishing a precision and constant voltage on the gate of FET 82. The value of source resistor 92, the Vz of zener 90, the Vgs of FET 82 and the value of the −15 Vdc are used in calculating the value of the voltage at the source of FET 82. The value of the voltage difference between the −15V supply and the voltage at the source of FET 82 divided by the value of the source resistance 92 provide an approximation of the total bias current leaving summing node 87 via resistor 92.

The bias and control circuit 78 is coupled to be responsive to the control signal 48 at the band pass amplifier output 67 to provide a composite bias and control current represented by ray 80 through the ELED 15. Resistor 94 connects the cathode of the ELED 15 to the control signal at the bandpass amplifier output 67. The anode of the ELED 15 is shown connected to the +5 Vdc source. When forward biased, the ELED 15 operates to clamp the second end of resistor 84 to a voltage level one ELED Vf voltage drop below the value of the +5 Vdc supply level.

As the control signal at the output of the band pass amplifier output 67 varies with time, the difference between the control signal voltage and the voltage at the cathode of diode 15 divided by the value of the resistor 94 establishes the instantaneous current supplied to the summing point 87 for subtraction from the composite bias and control current represented by ray 80 to the anode of ELED 15. The composite bias and control current is amplified and phased or polarized to drive the ELED 15 so as to substantially cancel the relative intensity noise present on light source 16 from optical amplifier 12.

As shown, the drain of N-Channel FET Q1 88 is connected to the cathode of the ELED 15. The gate to source voltage Vgs is increased by the output of the bias source amplifier 86 until the current into resistor 92 raises the voltage at the source of FET 82 and the inverting input of operating amplifier to equal the voltage at the non-inverting input (+) and correspondingly on the anode of the precision voltage reference zener 90. The result of this operation is that the voltage across resistor 92 is fixed and therefore the total current through the channel of the FET 82 is fixed.

Zener diode 90 is typically selected to have a 6.1 or 6.6 Vz so as to be least sensitive to temperature variations. The operating current of the zener 90 is established with reference to the data sheets for the particular reference zener, and by the voltage difference across resistor 92. The operating voltage of zener 90 is applied to the non-inverting input to the amplifier. As an alternative to the zener, a three terminal voltage reference integrated circuit can be used to supply the required voltage to the non-inverting input.

Referring again to FIG. 3, it can be seen that the output of the bias source amplifier 86 will rise to bring FET 88 into conduction and increase current through the source resistor 92, in response to a positive rise in the the buffered signal 42. An increase in the voltage across resistor 94 results in a further increase in the total current entering summing point 86 via resistor and therefore through to conduction channel of FET 82 thereby raising the voltage on source of FET 82. As the conductivity of the channel is increased, the inverting input to bias source amplifier 86 increases until the voltage reaches the value of the voltage applied to the non-inverting input of the amplifier 86.

The output of the amplifier 86 increases or decreases as required thereafter to force the voltage on source resistor 92 to equal the voltage on the zener 90. The result is that the current through source resistor 92 is the difference between the zener voltage and the −15 Vdc supply. The current through source resistor 92 is therefore fixed and equal to the voltage difference across source resistor 92 divided by its resistance value. None of the current through source resistor 92 is supplied by the output of the amplifier 86. All of the current passes through the channel of FET 82. Bias current through the ELED 15 is therefore reduced as current is increased through resistor 94 by an increase in control signal because the sum of the currents into the channel of the FET must remain substantially constant.

Figure 5:
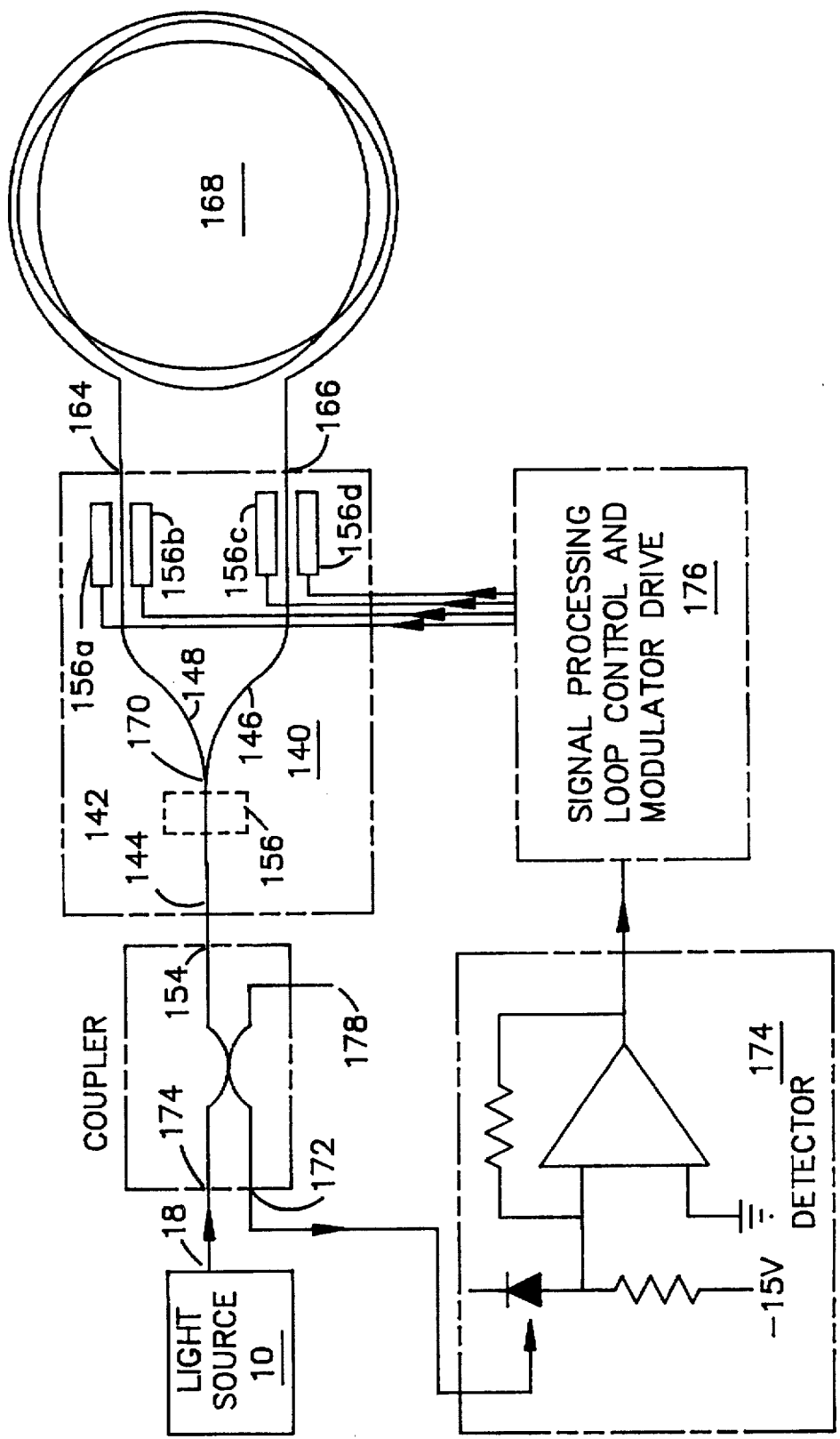
FIG. 5 is a schematic representation of a fiber optic gyro.

FIG. 5 is a schematic representation of a fiber optic gyro, (FOG) or fiber optic rotation sensor or sagnac rotation sensor, similar in topology to those variously described in U.S. Pat. No. 5,046,808 issued Sep. 10, 1991 and U.S. Pat. No. 5,393,371 issued Feb. 28, 1995 to Chin L. Chang et al, U.S. Pat. No. 5,033,854 issued Jul. 23, 1991 to A. Mathews et al, U.S. Pat. No. 4,997,282 issued Mar. 5, 1991 and U.S. Pat. No. 5,020,912 issued Jun. 4, 1991 both to G. Pavlath, and U.S. Pat. No. 5,189,488 issued Feb. 23, 1993 to J. Mark et al, the contents of each of the foregoing patents being hereby acknowledged. Each of these references have an assignee common to this application. The contents of each of the previously cited references are incorporated herein by reference in their entirety.

The FOG of FIG. 5 uses a power boosted source of broadband optical power 10, and an integrated optics device 140 formed in and on a wafer or substrate 142 typically of optically active material such as single crystal Lithium Niobate (LiNbO$_3$) for use in an integrated electro-optic Y shaped coupler and modulator. The substrate 142 has a top surface with at least a first optical waveguide 144 delineated or formed therein. Second and third optical waveguides 146, and 148 are formed within the substrate 142 to guide optical signals along a selected path or optical axis of propagation.

In the Y-Coupler and modulator configuration of FIG. 5, optical power is sent from the optical output port 18 through coupler 22 (not shown) within light source 10, to coupler 152. A pigtail fiber 154 couples the optical output from the coupler 152 to the Multifunction Integrated Optic Chip (MIOC) 140 for connection to the first optical waveguide 144. The first optical wave guide 144 performs a the function of a polarizer 156 on the optical power passing through it to the modulator 158 comprising modulator plates 156a–156d on the surface of MIOC 142 via second and third waveguides 146, 148. After passing through the top and bottom branches of the modulator 158, the modulated optical power is coupled to the first and second ends of fiber optic coil 164, 166 for circulation in a fiber optic coil 168 in clockwise and counterclockwise directions.

After the modulated clockwise and counter clockwise waves propagate through the entire length of the fiber coil 168, they pass back into and through the phase modulator the then into the Y-junction where they form a detectable output by interference at the Y-junction 170. The output optical signal passes through coupler 152 from the right to the left and about half of the available output optical signal passes out of port 172 and reaches the detector 174 for detection of the output optical signal.

As explained above in connection with FIGS. 1, 2 and 3, the power boosted source of broadband optical power 10 uses a power boosted ELED source of broadband optical power to form the output out of optical output port 18. The power boosted source of broadband optical power 10 has an electrical power source, 11, an ELED diode 15 powered by a bias current from the electrical source 11. The ELED provides an output optical signal 14 to the input 20 of optical amplifier 12.

The optical fiber amplifier input port receives the output optical signal from the ELED and amplifies the output optical signal to provide the power boosted optical signal out of the output port 18.

As shown in FIG. 5, the fiber optic gyro 138 comprises a fiber optic sensing coil 168 that has opposite ends 164, 166. A substrate 156 has a first, second and third optical waveguides 144, 146 and 148 formed in the substrate to guide optical signals from the optical signal source 154 along selected axes of propagation. Each waveguide terminates in an end surface. The first second and third waveguides are connected at a junction 170 to form a Y-coupler such that the power boosted optical signal out of the output port 18 out of the optical fiber amplifier is input to the integrated optics chip at the first optical waveguide input port 154.

The power boosted optical signal propagates through the first optical waveguide 144 to the Y-coupler 170 and splits to propagate between the second and third optical waveguides 146, 148 to pass into opposite ends 164, 166 of the fiber optic sensing coil 168. The ends of the fiber optic coil are connected to the ends of the second and third waveguides using the methods described in U.S. application Ser. No. 08/473,127 filed Jun. 7, 1995 (pending) for a "System and Method for Aligning and Attaching Optical Fibers to Optical Waveguides, and Products Obtained Thereby" to Ike Song et al or in that alternative, from U.S. Pat. No. 5,046,808 issued Sep. 10, 1991 and U.S. Pat. No. 5,393,371 issued Feb. 28, 1995 to Chin L. Chang et al all of which are incorporated herein by reference in their entirety.

The optical signals propagate as clockwise and counter clockwise signals. The propagating signals exit the fiber optic sensing coil 168 and enter the integrated optics chip via the ends of the second and third optical wave guides 146, 148 in directions opposite to their original passage. The clockwise and counter clockwise optical signals propagate to the Y-junction to combine and interfere with one another to form an interference signal.

Coupler 152 has a first optical fiber pigtail 174 that couples the power boosted optical signal from the output port 18 to the coupler first input port. The coupler 152 divides the available boosted optical signal and outputs a portion of it to the first waveguide via the multifunction integrated optic chip input port via pig tail 154.

The multifunction integrated optics chip 140 represents a means for controlling the polarization of light guided by the optical wave guides such as block 156 and for modulating the phase of light guided through the second and third optical waveguides such as modulator 158 driven by control loop electronics 176. The polarizer can be formed b external components or by making the waveguides highly bi-refringent by the method characterized in U.S. Pat. No. 5,193,136 which issued on Mar. 9, 1993 to Chin L. Chang et al, for a "Process For Making Multifunction Integrated Optics Chips Having High Electro-Optic Coefficients" and having a common assignee the contents of which are incorporated herein by reference in their entirety.

Photodetector 174 represents a means for detecting the interference pattern of light waves on the interference signal. Block 176 represents a signal processing means for determining and outputting the rotation rate of the optical fiber sensing coil. A signal processing means using a method random modulation is depicted in the method and apparatus shown in U.S. Pat. No. 5,123,741, to Gunter Spahlinger for a Fiber Optic Sagnac Interferometer With Digital Phase Ramp Resetting via Correlation-Free Demodulator Control assigned to Litef Gmbh, Freiburg, Fed. Rep. of Germany. The contents of this patent are incorporated herein by reference in their entirety. An alternative method and apparatus for electronically closing the signal processing loop is taught by U.S. Pat. No. 5,189,488 issued Feb. 23, 1993 to J. Mark et al, for a "Fiber Optical Gyroscope Utilizing Orthogonal Sequences" and having a common assignee. The contents of his patent is incorporated herein by reference in its entirety.

Referring again to FIG. 5, it should be understood that coupler 152 can also be viewed as an optical splitter coupled to receive all of the power boosted optical signal out of the optical fiber amplifier output port 18 at an input port 174. The splitter is further characterized to divide the boosted optical signal to and provide at least two splitter output optical signals at respective splitter output ports 154 and 178 to at least two fiber optic gyros (the second gyro is not show coupled to port 178.) Each fiber optic gyro has a respective first optical fiber such as pigtail 154, for coupling a respective splitter optical signal from a respective splitter output port to the respective substrate first waveguide such as the first waveguide 144 in chip 140. U.S. Pat. No. 5,184,195 to E. Goldner issued Feb. 2, 1993 for a Triaxial Fiber Optic Sagnac Interferometer With single Source and Detector, having a common assignee, shows a coupler 24 dividing the optical power from a single source preparatory to further distribution to three gyros.

Although the invention has been disclosed and illustrated in detail, it is to be understood that the same is by way of illustration as an example only and is not to be taken by way of limitation. The spirit and scope of this invention is to be limited only by the terms of the appended claims.

What is claimed is:

1. A power boosted source of broadband optical power comprising:
   an electrical power source;
   an ELED diode powered by a bias current from the electrical source, the ELED providing a broadband output optical signal and;
   an optical fiber amplifier having an input port and an output port, the input port being coupled to receive the broadband output optical signal from the ELED as an input optical signal, the optical fiber amplifier amplifying the input optical signal and providing a power boosted optical signal out of the output port.

2. The power boosted source of broadband optical power of claim 1 further comprising:
   an optical amplifier relative intensity noise reduction system for coupling a sample portion optical signal from the power boosted optical signal to a detector and detecting and converting the amplitude intensity of the sample portion signal to form a detected electrical signal, for processing the detected electrical signal to modify the bias current to form a composite bias and control current through ELED 15 to reduce relative intensity noise on the power boosted optical signal out of the output port.

3. The power boosted source of broadband optical power of claim 1 further comprising;
   an optical amplifier relative intensity noise reduction system for coupling a sample portion signal from the power boosted optical signal to a detector and detecting the sample portion signal to form a detected signal,
   an amplifier for amplifying the detected signal to form a buffered signal;
   bandpass filter and bias and control circuit means for amplifying and filtering the buffered signal to form a control signal and for converting the control signal into a control current; and
   a bias and control circuit for combining the control current with a bias current to form the composite bias and control current to reduce relative intensity noise on the power boosted optical signal out of the output port.

4. The power boosted source of broadband optical power of claim 1 further comprising;
   an optical amplifier relative intensity noise reduction system for coupling a sample portion signal from the power boosted optical signal to a detector and detecting the sample portion signal to form a detected signal,
   an amplifier for amplifying the detected signal to form a buffered signal;
   bandpass filter and bias and control circuit means for amplifying and filtering the buffered signal to form a control signal and for converting the control signal into a control current; and
   a bias and control circuit, the bias and control circuit having a current source for extracting a constant current from a summing node, the anode of the ELED being connected to a first positive voltage and the cathode being coupled to the summing node, a scaling resistor being connected between the summing node and the control signal, the current through the scaling resistor to the summing node being summed with the current through the ELED to form the composite bias and control current through the ELED to reduce relative intensity noise on the power boosted optical signal out of the output port.

5. A fiber optic rotation sensor using a power boosted ELED source of broadband optical power comprising:
   an electrical power source;
   an ELED diode powered by a bias current from the electrical source, the ELED providing an output optical signal and;
   an optical fiber amplifier having an input port and an output port, the input port being coupled to receive the output optical signal from the ELED as an input optical signal, the optical fiber amplifier amplifying the input optical signal and providing a power boosted optical signal out of the output port;
   the fiber optic rotation sensor being coupled to receive the power boosted optical signal out of the output port and characterized to provide an output rotation signal.

6. The fiber optic rotation sensor using a power boosted ELED source of broadband optical power of claim 5 wherein the fiber optic gyro further comprises:
   a fiber optic sensing coil having opposite ends;
   an integrated optics chip having a substrate,
   a first, a second and a third optical waveguide being formed in the substrate to guide optical signals from the optical signal source along selected axes of propagation, each waveguide terminating in an end surface, the first second and third waveguides being connected at a junction to form a Y-coupler;
   a first optical fiber for coupling the power boosted optical signal from the output port of the optical fiber amplifier to the first waveguide;
   the power boosted optical signal propagating through the first optical waveguide to the Y-coupler and dividing between the second and third optical waveguides to pass into opposite ends of the fiber optic sensing coil to propagate as clockwise and counter clockwise signals, the propagating signals exiting the fiber optic sensing coil and re-enter the integrated optics chip at the second and third optical wave guides in directions opposite to their original passage, the opposite moving signals propagating to the Y-junction to combine and interfere with each other to form an interference signal;
   means for detecting the interference signal pattern of light waves on the interference signal and for providing a detected signal;
   signal processing means responsive to the detected signal for determining and outputting the rotation rate of the optical fiber sensing coil.

7. The fiber optic rotation sensor using a power boosted ELED source of broadband optical power of claim 6 wherein the fiber optic gyro further comprises:
   means for controlling the polarization of light guided by the optical wave guides and for modulating the phase of light guided through the second and third optical waveguides.

8. The fiber optic rotation sensor using a power boosted ELED source of broadband optical power of claim 5 wherein the fiber optic gyro further comprises:
   a fiber optic sensing coil having opposite ends;
   a bi-conical fused splitter having at least a first, second and third optical fibers formed to guide and split optical signals from the power boosted optical signal source, each optical fiber terminating in an end surface, the first second and third fibers being coupled at a junction to form a Y-coupler such that the power boosted optical signal out of the output port of the optical fiber amplifier is input to the coupler at the first optical fiber, the power boosted optical signal propagates through the first optical waveguide to the Y-coupler formed at the junction of at least the first, second and third optical fibers, the optical signal divides between the second and third optical fibers to pass into opposite ends of the fiber optic sensing coil and to propagate as clockwise and counter clockwise signals, the propagating signals exiting the fiber optic sensing coil and re-enter the second and third optical fibers in directions opposite to their original passage, the opposite moving signals propagating to the Y-junction to combine and interfere with each another to form an interference signal;

means for detecting the interference signal pattern of light waves on the interference signal and for providing a detected signal;

signal processing means responsive to the detected signal for determining and outputting the rotation rate of the optical fiber sensing coil.

9. The fiber optic rotation sensor using a power boosted ELED source of broadband optical power of claim 8 wherein the fiber optic gyro further comprises:

means for controlling the polarization of light guided by the optical fibers and for modulating the phase of light moving as counter propagating beams in the coil.

10. The fiber optic rotation sensor using a power boosted ELED source of broadband optical power of claim 5 further comprising:

means for controlling the polarization of light guided by the optical wave guides and for modulating the phase of light guided through the second and third optical waveguides.

11. The fiber optic rotation sensor using a power boosted ELED source of broadband optical power of claim 5 further comprising:

an optical splitter coupled to receive all of the a power boosted optical signal out of the optical fiber amplifier output port at an input port, the splitter being characterized to divide the boosted optical signal to and provide at least two splitter output optical signals at respective splitter output ports; at least two fiber optic gyros, each having a respective first optical fiber for coupling a respective splitter output optical signal from a respective splitter output port to a respective integrated optics chip first optical waveguide.

* * * * *